United States Patent [19]

Manhaeve et al.

[11] Patent Number: 6,118,293

[45] Date of Patent: Sep. 12, 2000

[54] HIGH RESOLUTION (QUIESCENT) SUPPLY CURRENT SYSTEM (IDD MONITOR)

[76] Inventors: Hans Manhaeve, Konijnenpijp 12, B-8200 Sint Michels, Brugge; Stefaan Kerckenaere, Mitswegenstraat 77, B-8480 Eernegem, both of Belgium; Viera Stopjakova, Oravska Veseke 458, 02962 Oravske Vesele, Slovakia

[21] Appl. No.: 08/866,543

[22] Filed: May 30, 1997

Related U.S. Application Data

[60] Provisional application No. 60/019,357, Jun. 5, 1996.

[51] Int. Cl.⁷ .................................................. G01R 31/26
[52] U.S. Cl. ........................................ 324/765; 324/158.1
[58] Field of Search ..................................... 324/763, 765, 324/158.1, 73.1, 537; 438/14, 17, 18; 257/40, 48; 340/660–663; 714/724, 733, 734, 735

[56] References Cited

U.S. PATENT DOCUMENTS

| | | | |
|---|---|---|---|
| 5,332,973 | 7/1994 | Brown et al. | 324/537 |
| 5,351,012 | 9/1994 | Toumazou | 330/264 |
| 5,352,989 | 10/1994 | Toumazou et al. | 330/265 |
| 5,392,293 | 2/1995 | Hsue | 371/15.1 |
| 5,608,329 | 3/1997 | Imamura . | |
| 5,731,700 | 3/1998 | McDonald | 324/158.1 |

FOREIGN PATENT DOCUMENTS

| | | |
|---|---|---|
| 0 383 397 A2 | 8/1990 | European Pat. Off. . |
| 0 386 804 A2 | 9/1990 | European Pat. Off. . |
| 0 386 804 A3 | 9/1990 | European Pat. Off. . |
| 0 432 291 A1 | 6/1991 | European Pat. Off. . |
| 0 672 911 A1 | 9/1995 | European Pat. Off. . |
| 07 244 125 | 9/1995 | Japan . |

OTHER PUBLICATIONS

European Search Report for 97870078.9 dated Jul. 20, 1998.
Chen and Abraham (1991), "High Quality Tests for Switch–Level Circuits Using Current and Logic Test Generation Algorithms," *International Test Conference*, pp. 615–622 (Month Unavailable).
Hawkins et al. (1989), "Quiescent Power Supply Current Measurement for CMOS IC Defect Detection," *IEEE Transactions on Industrial Electronics*, vol. 36, pp. 211–218 (Month Unavailable).
Hawkins and Solen (1985), "Electrical Characteristics and Testing Considerations for Gate Oxide Shorts in CMOS ICs," *IEEE Proceedings of International Test Conference*, Philadelphia, Pennsylvania, pp. 544–555 (Month Unavailable).
Hsue and Lin (1993), "Built–In Current Sensor for $I_{DDQ}$ Test in CMOS," *International Test Conference*, pp. 635–641 (Month Unavailable).
Lupon et al. (1993), "Compact Bic Sensor for $I_{ddq}$ Testing of CMOS Circuits," vol. 29, pp. 772–774 (Month Unavailable).
Maly and Patyra (1992), Built–In Current Teseting, *IEEE Journal of Solid–State Circuits*, vol. 27, pp. 425–428 (Month Unavailable).

(List continued on next page.)

*Primary Examiner*—Vinh P. Nguyen
*Attorney, Agent, or Firm*—McDonnell Boehnen Hulbert & Berghoff

[57] ABSTRACT

The present invention relates to a system for the measurement of a supply current of an electronic circuit, comprising:

a first part with control means for applying and controlling at least one voltage and one current on said circuit;

a second part being fed by an input voltage and delivering a first output voltage and a first output current on a first terminal and a second output current on a second terminal, said first output voltage being essentially equal to said input voltage, said second output current being essentially proportional to said first output current being said supply current;

a switch in between said first and said second part, being controlled by trigger means controlled by said first part, for turning said switch off or on whereby switching said second part in measurement mode or in bypass mode.

13 Claims, 11 Drawing Sheets

IDDQ Monitor configuration 1

OTHER PUBLICATIONS

Manhaeve et al. (1994), "An Off–Chip IDDDq Current Measurement Unit for Telecommunication ASICs," pp. 203–212 (Month Unavailable).

Rius and Figueras (1992), "Proportional BIC Sensor for Current Testing," *J. of Electrical Testing*, vol. 3, pp. 387–396 (Month Unavailable).

Rubio et al. (1995), "A Built–In Quiescent Current Monitor For CMOS VLSI Circuits," *IEEE*, pp. 581–585 (Month Unavailable).

Shen et al. (1993), "A 2–ns Detecting Time, 2–$\mu$m CMOS Built–In Current Sensing Circuit," *IEEE Journal of Solid–State Circuits*, vol. 28, pp. 72–77 (Month Unavailable).

Soden and Hawkins (1989), "Electrical Properties and Detection Methods for CMOS IC Defects," 1st European Test Conference, Paris France pp. 1–9 (Month Unavailable).

Wallquist et al. (1993), "A General Purpose $I_{DDQ}$ Measurement Circuit," International Test Conference, pp. 642–651 (Month Unavailable).

HIGH RESOLUTION (QUIESCENT) SUPPLY CURRENT SYSTEM (IDD MONITOR)

RELATED APPLICATIONS

This application claims priority on U.S. Provisional Patent Application Serial No. 60/019,357, filed Jun. 5, 1996.

FIELD OF THE INVENTION

The present invention relates to a system for the measurement of the supply current of an electronic device or of an integrated circuit. More in particular a system for supply current testing of an electronic device or integrated circuit is disclosed.

BACKGROUND OF THE INVENTION

It has been proven that quiescent supply current ($I_{DDQ}$) monitoring is a suitable test technique which can be used as well for the verification of electronic devices or circuits as well as to increase the test quality of said devices or circuits. Especially in function of improved test quality an accurate supply current measurement system is needed.

Among functional, stuck-at, stuck-open, and Quiescent current test strategies, no single test method guarantees detection of all types of defects in electronic devices. As types of defects in electronic devices, a number of defects occurring in digital CMOS devices can be mentioned, such as gate-oxide shorts, bridges and floating gates. Such defects are not detected by a conventional voltage based test approach. Many defects that pose reliability risks are detected only by $I_{DDQ}$ testing, therefore multiple and accurate $I_{DDQ}$ tests are necessary for CMOS devices or IC's. The $I_{DDQ}$ test is the most sensitive and comprehensive strategy, but is a relatively slow measurement technique. The Quiescent current testing technique is based upon the fact that defective devices produce an abnormally high value of power supply current ($I_{DD}$). The technique has been proven to be very efficient in detecting certain defects occurring in CMOS devices or IC's, requiring only a reduced number of test patterns.

The overall test cost of a circuit depends on the test pattern generation time, the fault coverage required, tester time for each unit of the circuit, and the number of circuits under test. While current test generation takes much less CPU time and generates fewer test patterns, testing a circuit using current tests (applied at kHz rates) requires more time than using logic tests (applied at MHz rates). Measuring the $I_{DDQ}$ current off-chip using a test monitor that is not on one chip with the electronic circuit or device that is tested causes difficulties for testing hardware and significantly decreases the test rate if standard measurement equipment, such as the Parametric Measurement Unit (PMU), is used. Basically two solutions to this problem exist. Using an on-chip monitor, integrated on one chip with the integrated circuit that is tested, can increase the test rate significantly. The alternative is to use a dedicated off-chip monitor. Nevertheless most $I_{DDQ}$ measurements in production testing nowadays are still done with off-chip instrumentation. A few experimental on-chip/off-chip current monitors have been proposed so far. One of them is already used in production testing.

To be able to perform $I_{DDQ}$ testing in an economical justified way, a dedicated measurement unit is needed. As on-chip built-in current monitors can achieve much higher testing speeds than off-chip alternatives, they have been evaluated as an appropriate choice for CMOS VLSI current testing.

Problem Definition

To measure accurately the quiescent supply current of the electronic circuit or Device Under Test (DUT), the measuring device should not influence the DUT's supply voltage and current in any condition, and be capable of driving the parasitic capacitance resulting from the DUT's supply wiring and decoupling capacitance. Most of the Built-in current monitors (BICs) presented so far are either intended to be inserted into the ground connection or leave the DUT's supply floating during measuring. By inserting a measuring device in the ground connection, a virtual ground for the devices under test is created, which when a current is flowing differs from the actual ground and thus affects the measurement accuracy.

The use of the Parametric Measurement Unit (PMU) available on a test system in a force voltage measure current mode offers a quantitative and accurate measurement. However the PMU is rather slow—measurement periods typically being 100 ms—and is not able to deliver switching spikes greater than 100 mA. As an example of such a device the PMU available on the Credence VISTAvision test system can be taken.

A monitor circuit called IDUNA, and disclosed in EP-0386804 was originally designed to serve as an on-chip monitor but can also be used as an off-chip monitor. The IDUNA generates a pass/fail decision based on an integrated comparison of the $I_{DDQ}$ against a scaled reference current. The advantage of the circuit is that its possible to reach high measuring speeds, improved accuracy and noise immunity. The monitor is designed to operate at frequencies above 1 MHz. Despite its advantages however, the IDUNA is not capable of driving high capacitive loads. It cannot deliver high transient currents and requires a complex characterisation and calibration procedure as its measurement characteristic is non linear. The IDUNA is intended to perform an accurate comparison of the measured quiescent current against a predefined reference current level rather than to perform an accurate current measurement of the quiescent current within a certain measurement range. Furthermore, due to its limited current delivering capability and limited capacitive load driving capability the IDUNA can only be used to test small circuits, and requires circuit partitioning in combination with the use of multiple monitors when on-chip current monitoring of bigger circuits is desired.

The OCIMU circuit, as disclosed in EP-0672911 is an off-chip monitor that is realised using discrete components. The OCIMU is capable of performing a relatively high speed (measurement time about 100 $\mu$s for a 2 $\mu$F load) current measurement especially when driving a high capacitive load (up to several $\mu$F). This property is important as modern complex ASICs usually have multiple supply pins (sometimes more than 20). To assure a high quality stable supply on the chip a 100 nF decoupling capacitance is added to each of these supply pins. So a total decoupling capacitance of 2 $\mu$F or more is not uncommon. The OCIMU circuit is also able to deliver transient currents of up to 10 amperes. This is necessary as telecommunication ASICs can demand switching currents in excess of 5 amperes, whereas the normal quiescent currents drawn range from 0.1 to 100 $\mu$A. Furthermore the circuit requires only a minimum of easily performed calibration and delivers a well-regulated supply voltage to the DUT never leaving the DUT supply pin(s) floating. Another quality of the OCIMU is that this circuit attacks the problem of measuring the quiescent current in a hierarchical way. The circuit is designed such that first the order of magnitude of the $I_{DDQ}$ is determined, then only if the current is below a presettable level then an accurate measurement is performed. Otherwise the circuit is directly identified as a 'bad part', allowing the testing procedure to be speeded up. The drawbacks of the OCIMU circuit are that it can only serve as an off-chip monitor—as it cannot be easily integrated using a standard CMOS process due to its architectural concept—, that its testing speed is limited if current measurements with an accuracy of 1 μA or better are desired—mainly due to the noise generated by its building blocks—, and that the circuit is highly sensible to noise present on the DUT's supply reference terminal—a high quality supply is needed with a noise level less than 1 mV$_{ptp}$ to assure the monitor's measurement accuracy Aims of the Invention It is an aim of the present invention to disclose a test system for electronic circuits or devices which not only can serve for accurately measuring the quiescent supply current ($I_{DDQ}$) drawn by a circuit or device and for deciding whether the circuit or device is good or bad, but also can be easily adapted in function of the application with respect to the desired measurement range and the measurement accuracy.

It is another aim of the present invention to disclose a basic $I_{DD}$ measurement system which can be used for as well on-chip built-in current monitoring as for off-chip current monitoring in a broad range of applications.

It is a further aim of the present invention to disclose a test system that can be used for engineering as well as production testing which does not affect the supply voltage of the devices or circuits under test, which provides high speed and high accurate measurements, which can be easily integrated in a standard CMOS process, which overcomes the partitioning problem associated with other built-in current monitors and which can be easily adapted in function of the application with respect to the desired measurement range and accuracy. The $I_{DD}$ monitor of the present invention achieves these goals and can be used either as an off-chip or as an on-chip built-in current monitor, in both cases providing improved characteristics in comparison to other measurement devices.

SUMMARY OF THE INVENTION

Yet, is disclosed a test system (also called monitor circuit in the sequel) for the measurement of a supply current of an electronic circuit, comprising: a first part with control means for applying and controlling at least one voltage and one current on said circuit; a second part being fed by an input voltage and delivering a first output voltage and a first output current on a first terminal and a second output current on a second terminal, said first output voltage being essentially equal to said input voltage, said second output current being essentially proportional to said first output current being said supply current; and having a switch in between said first and said second part, being controlled by trigger means controlled by said first part, for turning said switch off or on whereby switching said second part in measurement mode or in bypass mode. The system can further comprise a third part with means for comparing said second output current with a reference whereby testing said circuit. The second part of the system can be fabricated as an integrated circuit by preference in a CMOS technology. Said second part can also be integrated with said electronic circuit under test on one integrated circuit. Said switch can be a compensated switch for minimising the charge transfer from said switch to said circuit.

The system of the invention can be configured as a $I_{DD}$ measurement system which can be used for built-in current monitoring as for off-chip monitoring in a broad range of applications and for as well engineering as production testing. The system does not affect the supply voltage of the devices or circuits under test and provides high speed, high accurate measurements. The system of the invention provides improved characteristics in comparison to other comparable $I_{DDQ}$ measurement devices. The system can be based on a CCII+ current conveyor structure and can be placed in the VDD power supply line of the device under test (DUT). The system can be used to either to decide if the device or circuit under test is good or bad, based upon a comparison of the second output current against a given reference, or to measure accurately the current drawn by the device or circuit under test. The monitor can be made easily programmable to allow the user to select the desired configuration in function of desired measurement range, accuracy and speed requirements in function of loading conditions.

The present invention can be used either as built-in current monitor as well as external test device which could further be integrated into existing Automated Test Equipment (ATE).

The system can be used as a built-in on-chip monitor, being integrated with the said device under test on one chip, or it can be used as an external monitor device which is not integrated with said integrated circuit. The system of the present invention can be used as well for engineering and development purposes as for production testing.

DETAILED DESCRIPTION OF THE INVENTION

Figure 1:
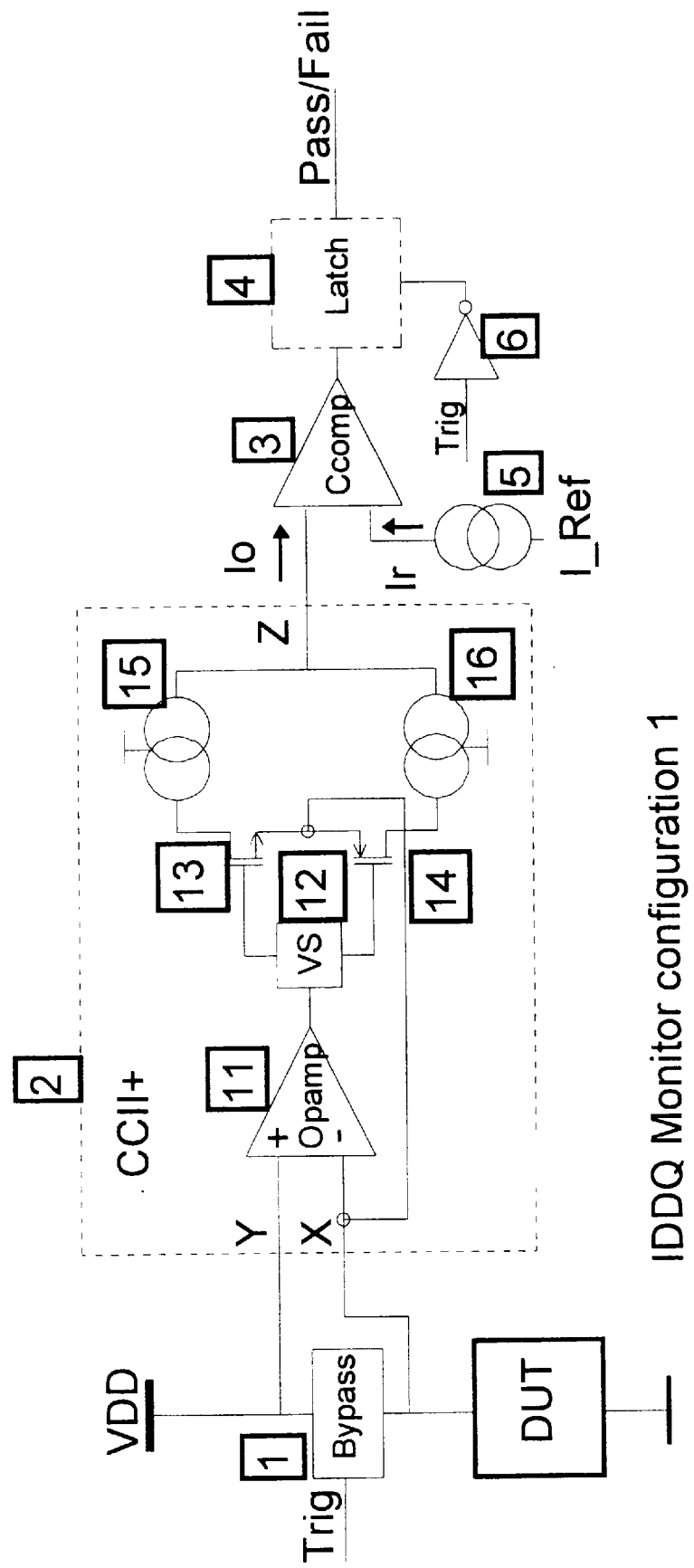
FIGS. 1 & 2 show two basic monitor configurations according to the preferred embodiment of the invention.

As an example of how to realise the system of the invention, two basic test configurations are detailed below which only differ in the way that the measurement signal is processed. The two basic configurations are shown in FIGS. 1 and 2.

The system (also called monitor circuit in the sequel) of the invention comprises basically a bypass unit (1), a second generation current conveyor based measurement unit (2), a comparison/evaluation unit (3) and an optional latch unit (4) to hold the measurement result until the result of the next measurement is valid. The latch is controlled by the inverse of the signal TRIG, which controls the operation of the bypass unit, generated by the inverter (6). The two basic units differ in the way the comparison with respect to a reference is performed. In both cases the monitor circuit can be used either to compare the measured current against a predefined reference value and in that way deciding whether the circuit is good or bad or to measure accurately the current drawn by the DUT by changing the reference to which the current is compared to, to measure the reference value which makes that the comparator used changes state. Out of the value of the reference used, the actual current drawn can then be easily calculated.

The bypass unit (1) is used to deliver the transient currents to the DUT which occur when the state of the DUT is changed, this unit comprises basically of a power MOSFET with very low on resistance. To avoid charge transfer from the bypass to the DUT, which influences the measurement, when the bypass switch changes state, a compensation is required. The measurement unit measures accurately the current drawn by the DUT when the bypass is not active, without affecting the DUT's supply voltage and generates at its output a current which is directly proportional and at least equal to the current drawn by the DUT. To achieve this a second generation based current conveyor structure is used (2), consisting of a regulating opamp (or ota) (11) with high slew rate to have a short reaction time, necessary to keep the voltages on its two inputs equal in function of changing load conditions, a voltage shifting circuit (12) to avoid cross-over distortion, a pair of complementary MOS driving transistors (13,14) which deliver the current required by the DUT and a pair of either simple or regulated cascode current mirrors (15,16) to copy the current drawn by the DUT and to generate the output current of the measurement unit. The further processing of this output current Io is then function of the basic configuration used.

Figure 2:
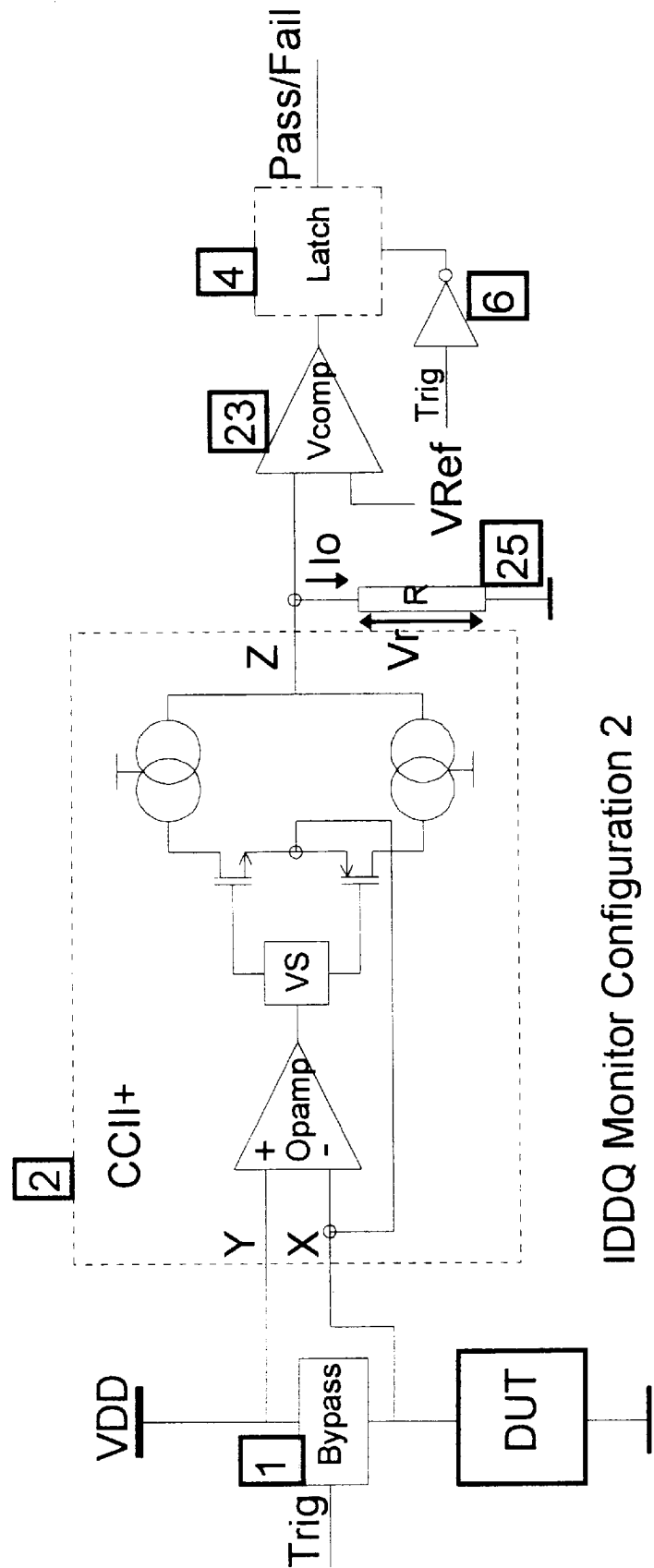

For the first configuration, depicted in FIG. 1, a high accurate current comparator (3) is used to compare the measurement value (Io) against an internal reference current (Ir). This internal reference current is inverse proportional to the externally supplied reference current (Iref) using a current mirror (5) with a mirror factor of 1/100. This to minimise the influence of variations on the external reference onto the measurement result. A latch (4) can then be used to sample the result of the comparison at the end of the measurement cycle.

For the second basic configuration, depicted in FIG. 2, a resistor (25) is used to convert the output current Io into a voltage. The voltage across the resistor (Vr) is then compared to an externally supplied reference voltage (Vref) using a voltage comparator (23). Again a latch (4) can then be used to sample the result of the comparison at the end of the measurement cycle. Changing the value of the resistor (25) allows to create different measurement ranges, based upon the interaction of the resistor on the operation of the current mirrors (15,16) which produce the measurement value Io.

Based upon these two basic configurations, other monitor structures can be created.

To evaluate the working principle and the operating conditions of the invention described, in a preferred embodiment of the invention, a layout of the monitor was made, processed and tested. The monitor was fabricated as an integrated circuit being processed in the Mietec 0.7$\mu$ CMOS technology. Hereafter a brief overview of the specifications of the fabricated monitor are given:

Technology used: Mietec 0.7 $\mu$m N-well CMOS 5V.

Monitor supply: 5V

DUT supply: 3.3V

Sensitivity: 50 nA.

Accurate measurement range: 100 nA to 600 $\mu$A.

Accuracy <=10 nA for currents in the range from 50 nA to 10 $\mu$A

Maximum DUT supply voltage degradation: 100 mV for transient currents of 100 mA.

Maximum supply voltage degradation during quiescent current measurement is 40 mV.

Test frequency of 1 MHz for Cload up to 200 pF

The 5V monitor supply can be disconnected if the monitor is not needed.

A 1$\Omega$ compensated PMOS switch is used to bypass transient currents, the area of the switch is 650×205 $\mu$m$^2$.

The monitor is able to handle huge digital ASIC circuits.

The total area of the integrated monitor is 0.22 mm$^2$.

As stated above, as technology to implement the monitor circuit the MIETEC 0.7 $\mu$m CMOS process was used. The use of this technology is however no restriction for the realisation of the monitor, also other CMOS technologies known in the art can be used to implement the design. The demonstrator circuit is dedicated to measure the I$_{DDQ}$ of DUTs which require a 3.3V supply, this however is also not a restriction for the present invention as the monitor circuit can be easily adapted or redesigned in function of different DUT supply voltages, or adapted to be able to operate for a given range of DUT supply voltages. Another advantage of the present invention is that only one monitor circuit is needed to measure the current of the device under test, irrespective of its complexity. As a result there are basically three ways in which the present invention can be used to perform its task. This is illustrated in FIG. 3.

Figure 3:
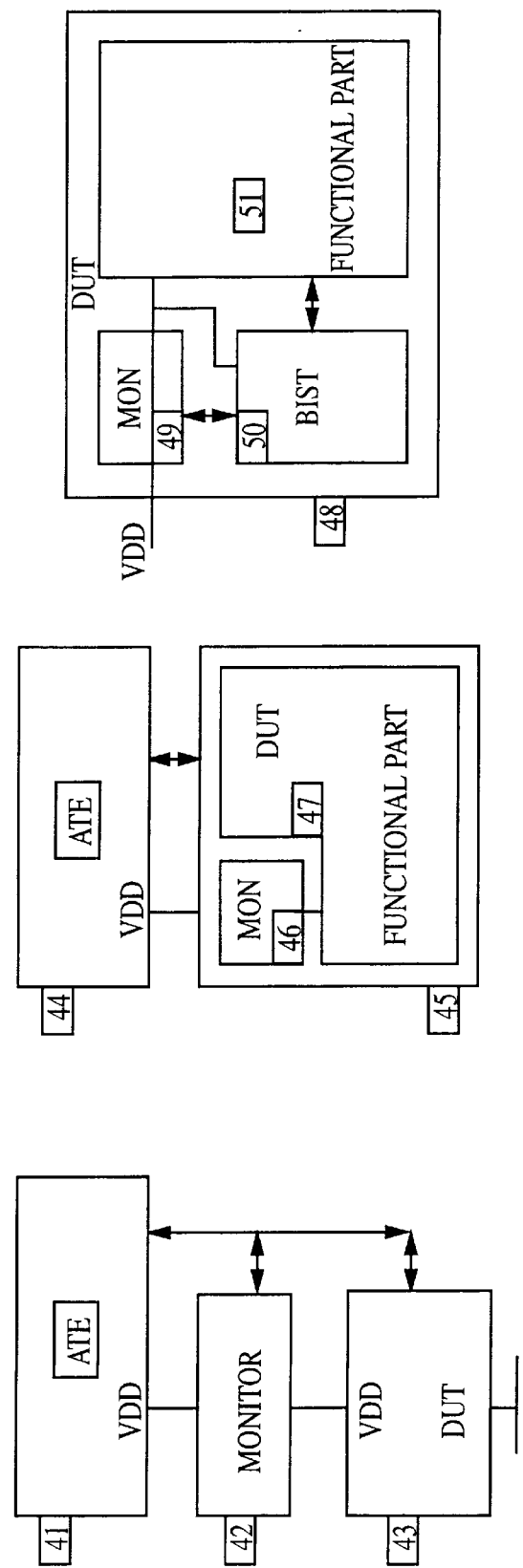
FIG. 3 shows basic configurations in which the monitor can be used.

A first configuration in which the monitor can be used is shown in FIG. 3.*a*. In this configuration the monitor (42) is used as an off-chip monitor. The connection from the VDD supply from the ATE (Automated test Equipment) (41) to the VDD terminal of the DUT (43) is cut and the monitor is inserted between the ATE and the DUT. The ATE is controlling both the operation of the monitor as well as the operation of the DUT during the test process.

The second way the monitor can be used is depicted in FIG. 3.*b*. In this configuration the monitor (46) is integrated together with the functional circuitry (47) and both form the DUT (45). Again the ATE (44) controls the operation of the DUT (=monitor+functional circuitry) during the testing process.

A third way the monitor can be used is shown in FIG. 3.*c*. In this configuration the monitor (49) is integrated together with the DIST (Built-in Self Test) circuitry (50) and the functional circuitry (51) as one single chip, the DUT (48). This is the configuration of a self testable device of which the BIST circuitry controls the operation of both the monitor as well as the functional circuitry when the DUT is put in test mode. Using such an approach allows the circuit to verify as well its functional behaviour as well as its current behaviour without the need of external test circuitry.

The Bypass Unit (1)

Figure 4:
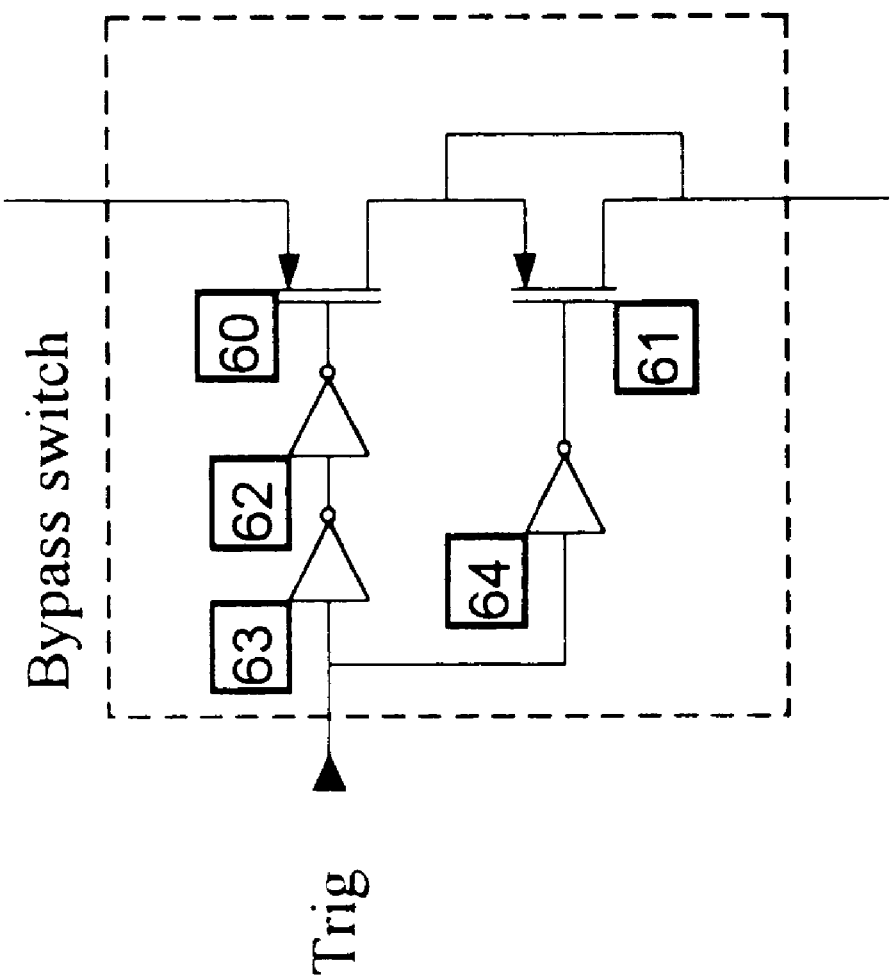
FIG. 4 shows how the required compensated switch could be realised in the preferred embodiment of the invention.

The bypass unit (1) is used to deliver the transient currents to the DUT which occur when the state of the DUT is changed, this unit consist basically of a power MOSFET with very low on resistance. To avoid charge transfer, which influences the measurement, from the bypass to the DUT when the bypass switch changes state, a compensated switch is required. When the bypass switch is integrated together with the other monitor circuitry, a compensated switch can be realised. FIG. 4 shows a possible realisation of a compensated switch, consisting of the switch transistor (60) and a dummy transistor (61) of which the source and the drain are shorted, driven by the inverse of the control signal TRIG, generated by the inverter (64) which drives the bypass transistor via the buffer formed by the inverters (62–63). The on resistance of the bypass switch should be selected in function of the maximum transient current drawn by the DUT and the voltage drop allowed during transients. However in order not to influence the reaction time of the measurement part, the maximum voltage drop during bypass should be less than 100 mV.

The Measurement Unit (2)

The measurement unit (2) measures accurately the current drawn by the DUT when the bypass is not active, without affecting the DUT's supply voltage and generates at its output a current (Io) which is directly proportional and at least equal to the current drawn by the DUT. The further processing of this output current is then function of the basic configuration used. To achieve this a second generation based current conveyor structure is used, consisting of a regulating opamp (or ota) (11), a voltage shifting circuit (12), a pair of complementary MOS driving transistors (13,14) and a set of current mirrors (15,16).

The Current Mirrors (15,16)

The current mirrors (15,16) copy the current drawn by the DUT and generate the output current (Io) of the measurement unit (2). A current mirror factor of at least 1 is necessary to achieve accurate measurements. To realise these current mirrors (15,16) two possible configurations can be used. The first one is based upon the use of simple current mirrors, the second one makes use of regulated cascode current mirrors. The advantage of the use of simple current mirrors is that they have a broad working range and linear behaviour in their full operation range, independent upon temperature and loading conditions. The drawback of simple current mirrors is that the temperature variations may cause a small change in the mirror factor, however without affecting the linearity. This drawback can be overcome by using a bias current which is higher than the current drawn by the DUT, so that the current consumption of the mirrors is practically the same in measurement mode as in bypass mode. As a result the operating temperature will be independent of the current drawn by the DUT so that reliable and repeatable measurements are assured. Regulated cascode current mirrors have the advantage that due, to their self-regulating construction, they are not affected by temperature and process variations and thus provide the basis for repeatable and reliable measurements. The only drawback is that there is a lower bound for the linear operation range and that the linear operation range is temperature dependent.

The Complementary MOS Transistors (13,14)

The pair of complementary MOS driving transistors (13, 14) is used to supply the DUT with the required current, they should be designed in such a way that they can deliver the maximum current of the measurement range to the DUT without problems.

The Voltage Shifting Circuit (12)

The voltage shifting circuit (12) is necessary as an interface between the output of the regulating opamp (11) and the pair of complementary MOS transistors (13,14). This circuit takes care of a proper biasing of the pair of complementary MOS transistors (13,14) in order to prevent cross-over distortion which otherwise would affect the measurement results related to small currents.

The Regulating Opamp (11)

The basic task of the regulating opamp (11) is to maintain equal voltage values on its two input terminals, and in that way assuring a stable well know DUT supply voltage, and assuring that the DUT receives its required supply current by driving the current supplying pair of complementary CMOS transistors. To fulfil these tasks the opamp needs to have a high slew rate, typically >300 V/μs, a short reaction time, necessary to keep the voltages on its two inputs equal in function of changing load conditions, low output noise and as the opamp is contained into a feedback loop, the overall combination of opamp (11), voltage shifting circuit (12) and pair of complementary MOS transistors (13,14) should have a phase margin of at least 70°.

The Comparison Unit.

For the first configuration, depicted in FIG. 1, the comparison unit consist of a current comparator (3), a current mirror (5) and an optional latch (4). A high accurate high speed current comparator (3) with a hysteresis less than 1 nA is used to compare the measurement value (Io) against an internal reference current (Ir). This internal reference current (Ir) is inverse proportional to the externally supplied reference current (Iref) using a current mirror (5) with a mirror factor of 1/100. This to minimise the influence of variations on the external reference onto the measurement result. A latch (4) can then be used to sample the result of the comparison at the end of the measurement cycle.

For the second basic configuration, depicted in FIG. 2, the comparison unit consist of a resistor (25), a voltage comparator (23) and an optional latch (4). The resistor (25) is used to convert the output current (Io) into a voltage (Vr). The value of the resistor (25), in combination with the output impedance of the current mirror (15,16) which supplies the output current (Io) of the measurement unit (2), determines the measurement range of the $I_{DDQ}$ monitor. The fact that by changing the value of the resistor (25) the measurement range can be adapted is one of the basic advantages of this structure. The voltage comparator (23) compares the voltage across the resistor (Vr) to an externally supplied reference voltage (Vref). The hysteresis of the comparator (24) is one of the main factors determining the accuracy of the measurement, and also the main drawback. Therefor the hysteresis should be less than 2 mV. Again a latch (4) can then be used to sample the result of the comparison at the end of the measurement cycle. Changing the resistor value allows to create different measurement ranges, based upon the interaction of the resistor (25) on the operation of the current mirrors (15,16) which produce the measurement values.

OTHER CONFIGURATIONS

General

Based upon the two basic configurations, other monitor structures can be created, basically by modifying the back-end of the measurement unit (2) and/or the comparison unit, to expand the working conditions or to overcome some problem situations.

Each of the basic units can be made programmable to allow the user to select the desired measurement range or measurement accuracy or to select an optimised configuration in function of loading conditions. This can be done by adding a simple control unit (80), switches (S1–Sn) and repeating some parts of the circuitry needed to built the monitor. The control (80) unit then determines the operation state of the monitor circuit. A shift register or a counter are among the possible useful structures for the control unit. By making the Pass/Fail output bi-directional no additional pins are needed to achieve this programmability.

Replacement of the Voltage Comparator

Figure 5:
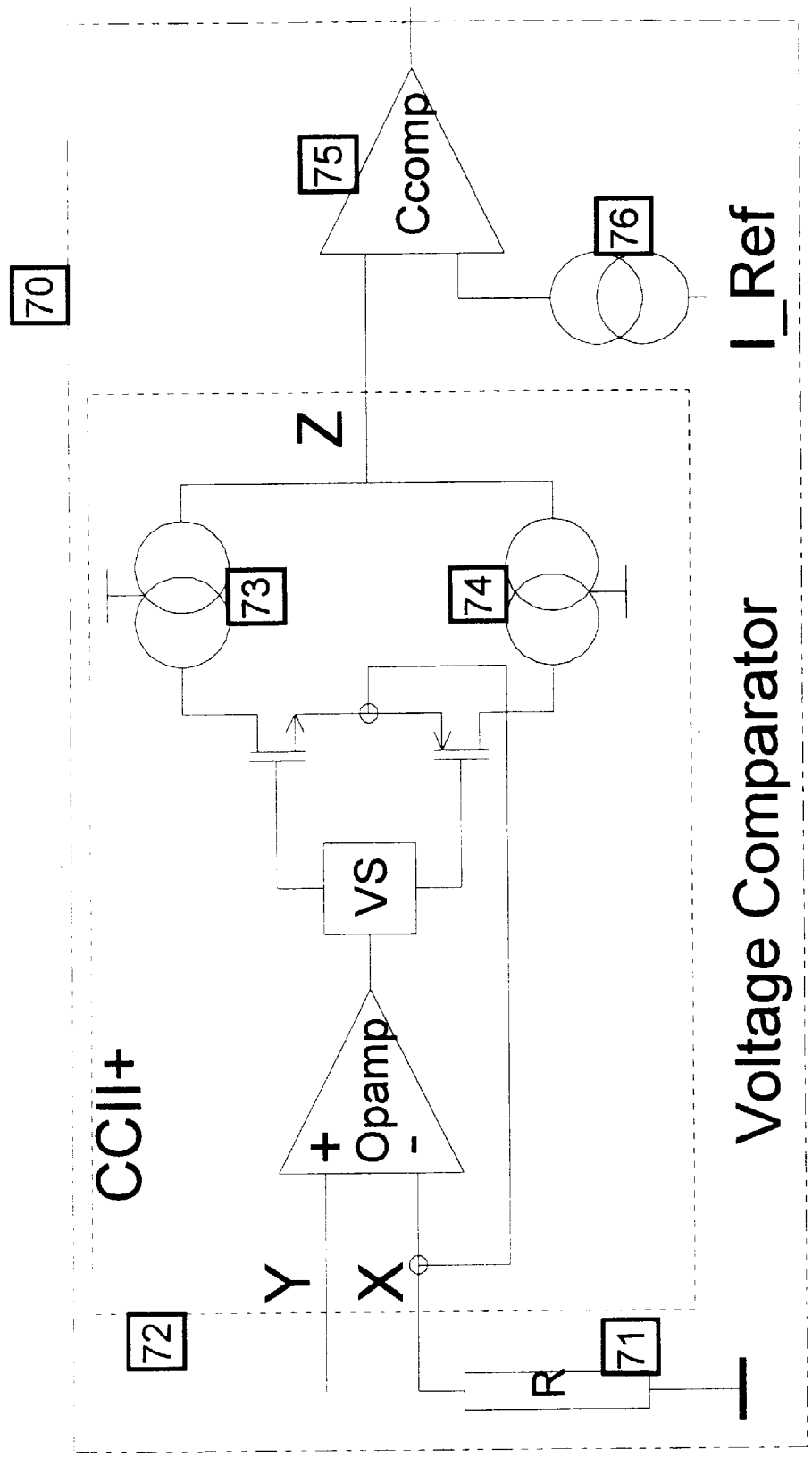
FIG. 5 shows an alternative for the voltage comparator used in basic configuration 2.
Figure 6:
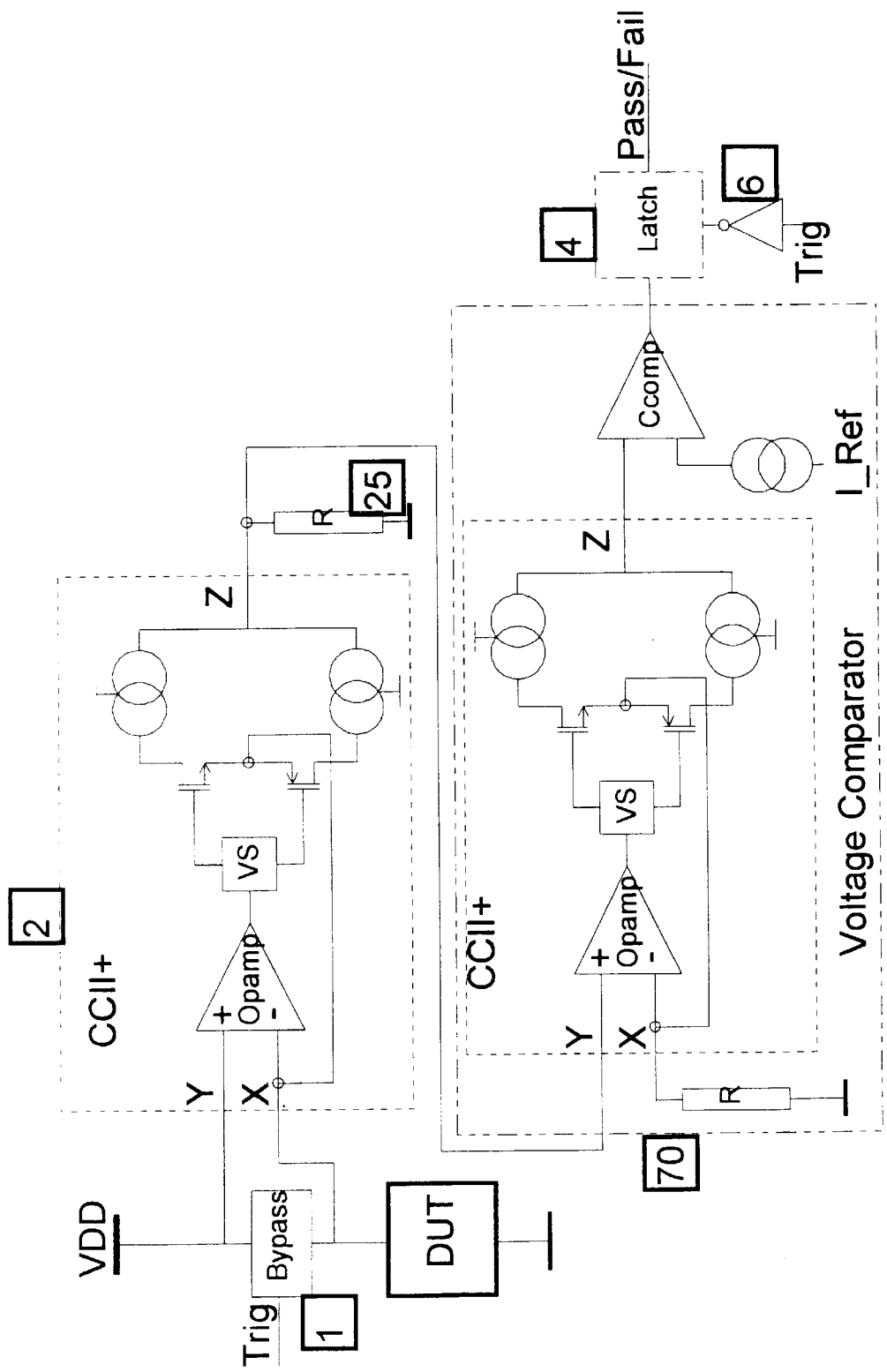
FIG. 6 shows the adapted basic configuration with the voltage comparator replaced by the alternative shown in FIG. 5.

To overcome the accuracy limits which occur when using a voltage comparator (23) due to its hysteresis, the configuration of basic structure 2 can be changed by replacing the voltage comparator (23) by a unit (70) consisting of a current comparator (75), the latter preceded by a measurement unit (72) as shown in FIG. 5. The measurement unit should make use of regulated cascode current mirrors (73,74), to assure independence of temperature and process parameters. At it X terminal a resistor (71), with the same value of the one (25) already connected to the output of the first measurement unit (2) and thus also to the Y terminal of the second measurement unit (70), should be connected. To assure accurate measurements the actual value of the resistors (25,71) used is off less importance than the fact that they should have equal values not to introduce additional errors. Taking this fact into account would allow to integrate the whole monitor without problems. As the measurement unit (70) proceeding the current comparator (75) does have to drive nearly no capacitive load, replacing the voltage comparator (23) by a combination of a measurement unit (70) and a current comparator (75) will not affect the overall measurement speed of the monitor. For all monitor alternatives listed hereafter which use one or more voltage comparators, the voltage comparators therein can be replaced by a the combination of a measurement unit and a current comparator The adapted total monitor configuration is shown in FIG. 6.

Programmable Monitor Configurations

Figure 7:
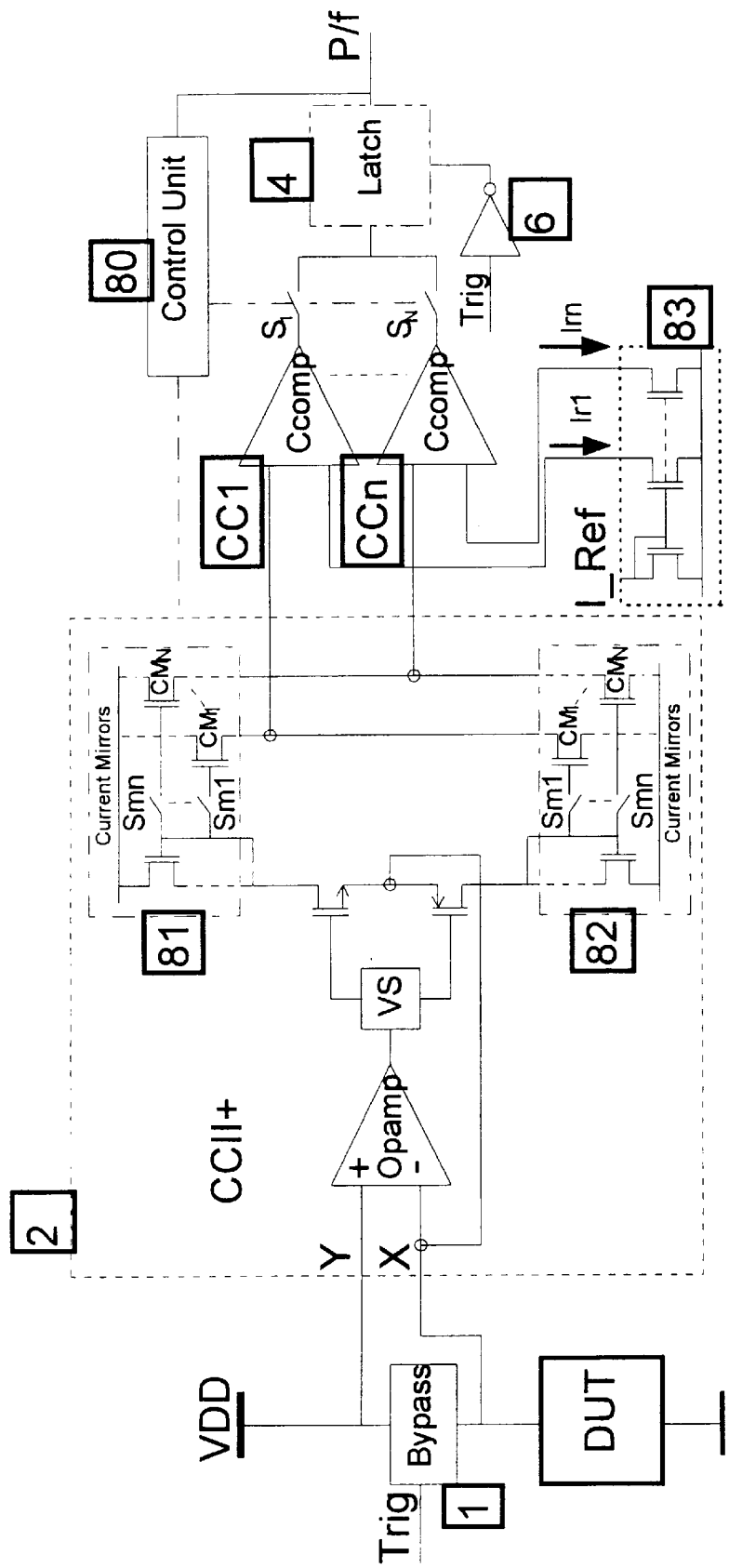
FIGS. 7–11 show different alternative embodiments which could be used to make the monitor circuit programmable so that the user can adapt the operation of the circuit in function of his needs.

The basic configuration 1 of the monitor circuit can be made programmable, as shown in FIG. 7. The objective is to provide different measurement ranges. This can be done by repeating the mirror stage ($CM_1$–$CM_N$) of the current mirrors (81,82) present in the measurement part (2) and using different mirror factors. Selecting mirror factors equal or bigger than 1 allows to create different measurement ranges. The largest measurement range is obtained by using a mirror factor equal to one. Using a larger mirror factor reduces the measurement range but allows more accurate measurements in favour. To the output of each mirror stage of the current mirror of the measurement unit a current comparator (CC1–CCn) is connected, each of them supplied by its own internal reference current (Ir1–Irn), derived out of the external reference current (I_Ref) using a current mirror (83) with repeated mirror stages, each of them with the same mirror factor. To the output of each of the current comparators (CC1–CCn) a switch (S1–Sn) is connected which connects them to the input of the latch (4) and which allows to select the desired measurement range and accuracy by closing one of the switches. As only voltages are switched, the switches can be build using simple transfer gates, controlled by the additional control unit (80). The switches (Sm1–Smn) within the current mirrors (81,82) of the measurement unit (2) are optional. They can be used to reduce the current consumption of the monitor by activating only one mirror stage at a time. This feature is useful for built-in current monitors.

Figure 8:
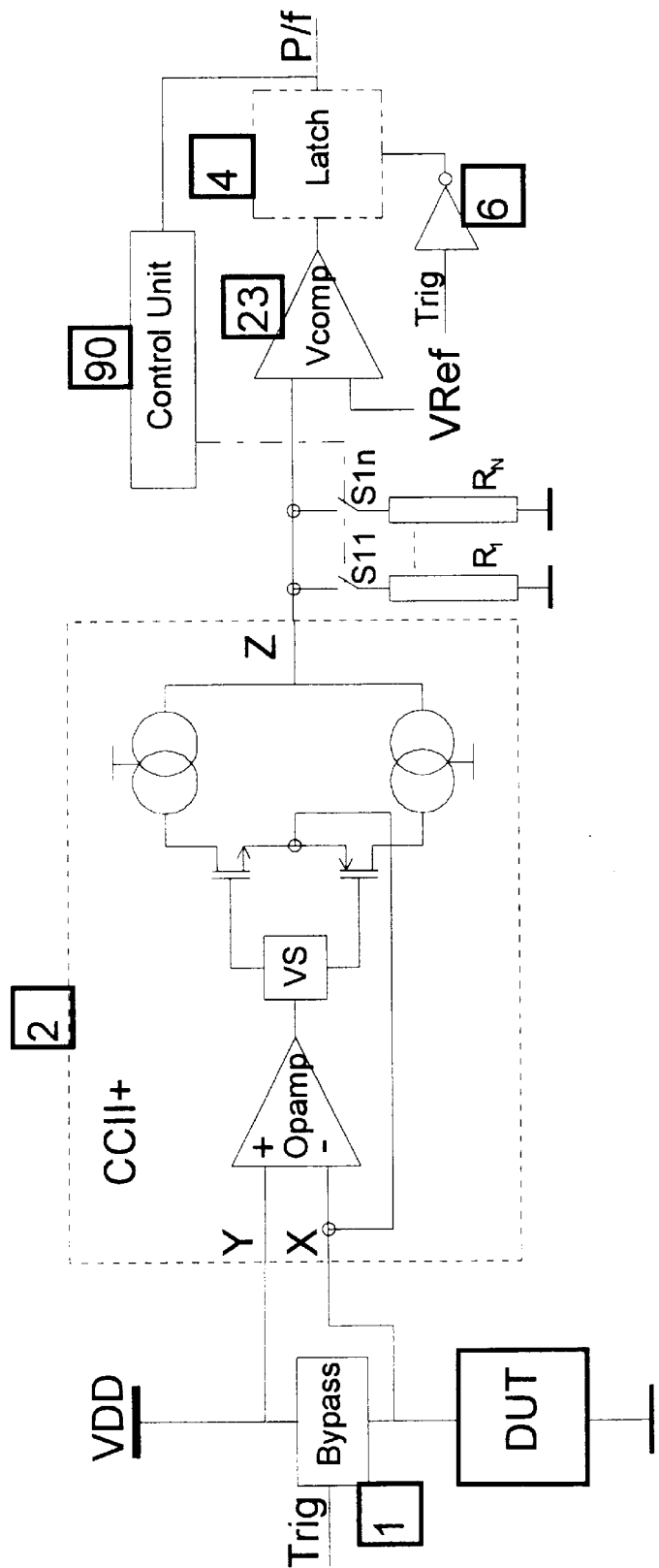
Figure 9:
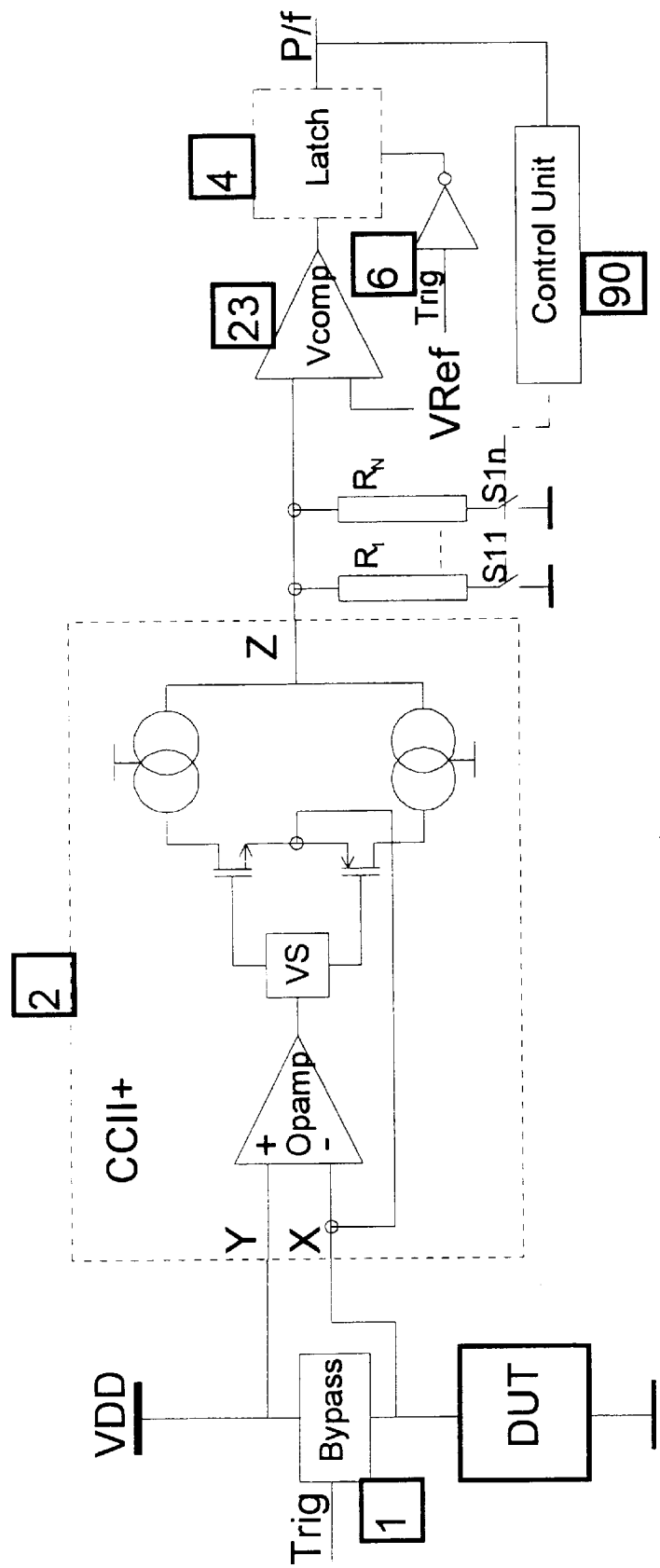

For the second basic monitor configuration different programmable configurations can be made. The first of these programmable configurations is shown in FIG. 8 and an alternative is shown in FIG. 9. As for basic configuration 2 the resistor (25) added to the output of the measurement part (2) determines the measurement range and the accuracy, changing the value of the resistor (25) allows to define the desired operating conditions. This can be done simply by replacing the resistor (25) or by adding several resistors ($R_1$–$R_N$) to the output of the measurement unit (2) and using switches (S11–S1n) driven by the control unit (90) to make the proper selection. The switches (S11–S1n) can be placed either in between the output of the measurement unit (2) and the resistor ($R_1$–$R_N$) (FIG. 8) or in between the resistor ($R_1$–$R_N$) and the ground connection (FIG. 9). The switches (S11–S1n) should be designed to have a low on resistance in order not to influence the measurement accuracy.

Figure 10:
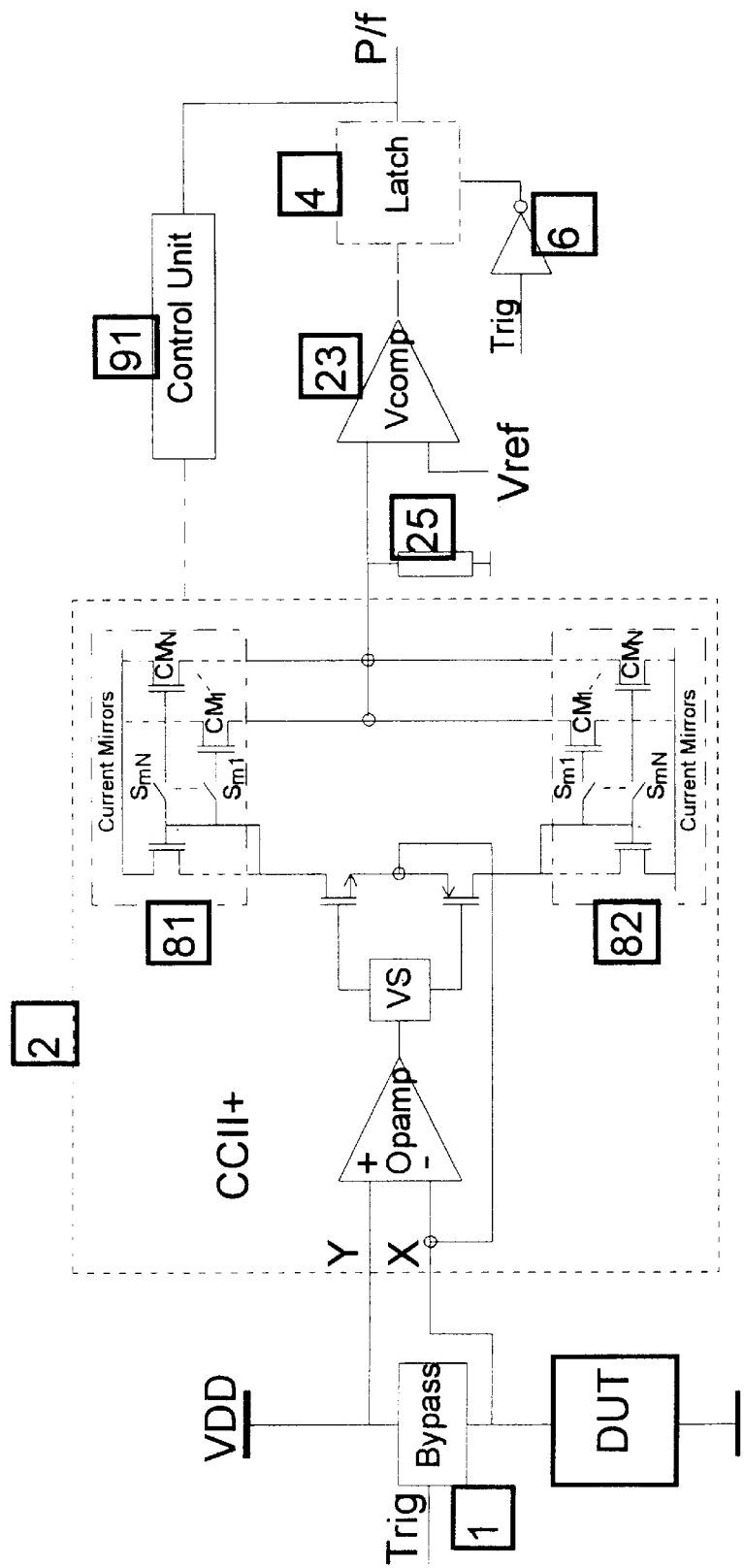

Another alternative to basic structure 2 is to make the monitor programmable in function of desired accuracy and measurement range by using one selected resistor (25) and to design the current mirrors (81,82) present in the measurement part (2) so that they comprise several mirror stages ($CM_1$–$CM_N$) which are selectable as shown in FIG. 10. As in this case only voltages are switched, simple transfer gates can be used to do the switching actions. In this way non-linearity which could be caused by the switches (S11–S1n) connected to the current to voltage conversion resistors ($R_1$–$R_N$) could be avoided.

Figure 11:
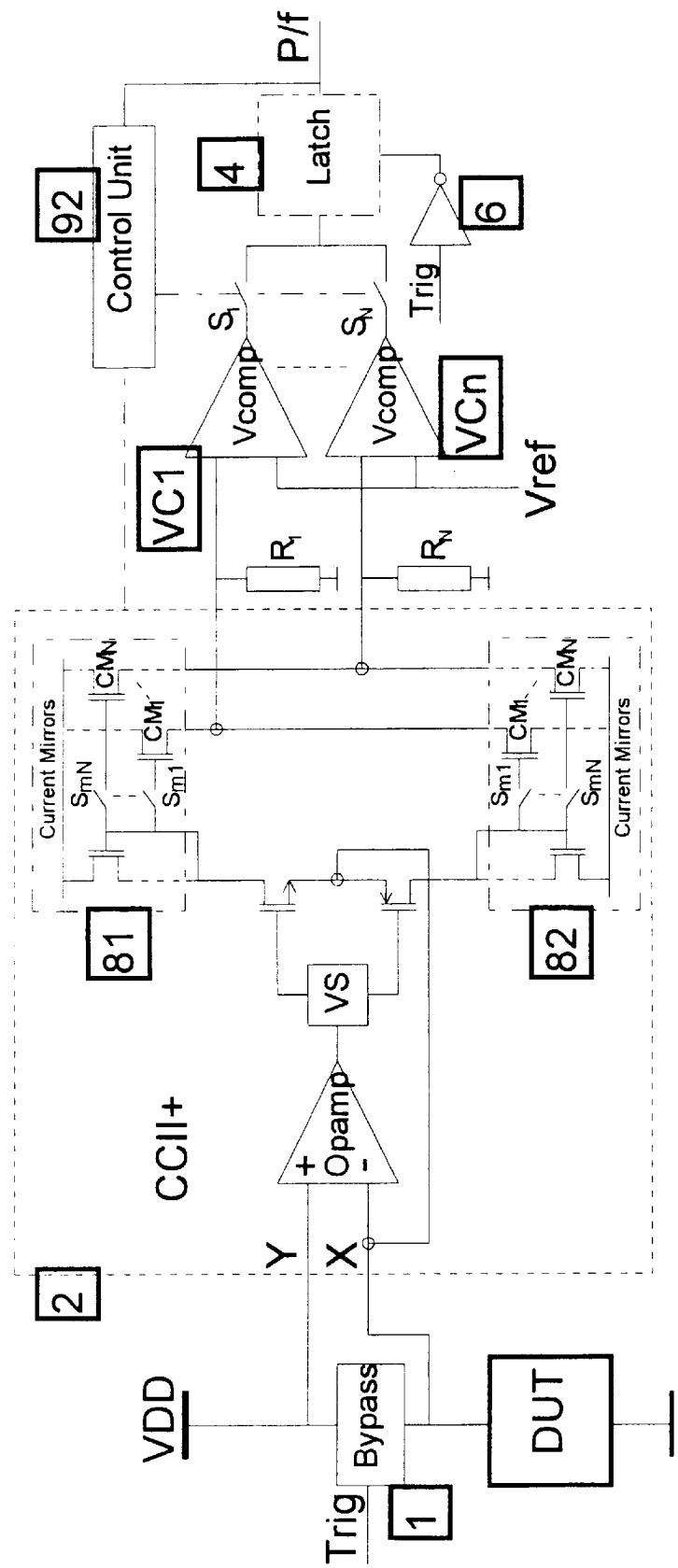

Another alternative to basic structure 2 is to make the monitor programmable in function of desired accuracy, measurement range and loading conditions by designing the current mirrors (81,82) present in the measurement part (2) so that it comprises several mirror stages ($CM_1$–$CM_N$) which are selectable and a voltage to current converting resistor ($R_1$–$R_N$) and accompanying comparator (VC1–VCn) connected to the output of each mirror stage, as shown in FIG. 11. By selecting a certain mirror stage ($CM_1$–$CM_N$) and the corresponding comparator (VC1–VCn) a certain monitor configuration is chosen. As in this case only voltages are switched, simple transfer gates can be used to do the switching actions.

Comparison with other Test Systems known in the Art

The comparison to the prior art is made in function of the basic configuration used. In general the monitor circuit presented here offers improved accuracy, combined with a high speed measurement rate, capacitive load driving capability, and measurement repeatability for a wide range of operating conditions, with neglectable influence on the DUT's supply voltage.

The monitor realised according to the first basic structure, as shown in FIG. 1, (using a current comparator) offers a far better resolution, a much broader measurement range and a much smaller voltage drop during measurement than other comparable BIC monitors. In comparison to [Rub] the accuracy obtained for the same measurement range is 10 times better and the testing rate is independent upon the current measured. The following table compares several previously published monitor with the monitor proposed here. The comparison is done with respect to the set of the following reported features:

technology of implementation sensitivity of the monitor accurate working area testing frequency indication of the type of device used to sense the supply current variation in power supply voltage when defective current being measured number of input/output pins needed to provide the performance of the monitor Total area of the monitor as indicated in the referenced publications

| BIC monitor | [Mal] | [She] | [Hsu] | [Lup] | [Rub] | The preferred embodiment of the Invention |
|---|---|---|---|---|---|---|
| Technology | 2 μm | 2 μm | No data | 1.5 μm | 1.2 μm | 0.7 μm |
| Sensitivity | No data | 20 μA | No data | No data | 100 nA | 10 nA |
| Accurate area | No data | 23 μA–330 μA | 25 μA | No data | 100 nA–100 μA | 50 nA–600 μA |
| Testing rate | No data | 30 MHz | 550 kHz | No data | No data | 1 MHz |
| Sensing elem. | BJT | PN | PN | PN | Capacitor | CCII+ |
| Variations in VDD/VSS | 400 mV | 650 mV | 700 mV | 600 mV | 100 mV | >40 mV |
| Number of I/O pins | 2/1 | 2/1 | 2/1 | 2/1 | 1/1 | 2/1 |
| Total area | No data | 8294 μm² | No data | 1440 μm² | 0.3 mm² | 0.22 mm² |

Note that "No data" indicates that the proper parameter has not been reported in the mentioned article.

In comparison to other $I_{DDQ}$ monitor circuitry such as the QuiC-Mon [Wal] and the OCIMU [Man] also better performances are noted. The QuiC-Mon v3.2 is based on the Keating-Meyer Method and achieves measurements rates ranging from 50 kHz–250 kHz for load capacitances in the range of 1 to 5 nF. During measurement the DUT is disconnected from the supply voltage, the resolution is 100 nA and the maximum measurement range is 25 μA.

In comparison, the circuit presented here maintains control over the DUT's supply voltage, offers a resolution which is 10 times better, has a much broader measurement range and has a measurement speed which is faster for the same loading conditions.

The OCIMU circuit uses a resistor as a sensing element and reaches a maximum measurement rate of 10 kHz for a load capacitance of 2.2 μF. The monitor has a resolution of 1 μA for currents ranging from 1 μA–1 mA. By decreasing the measurement speed, better resolutions can be obtained for the same capacitive load. The resolution also increases with preservation of speed, for decreasing capacitive loads. In comparison to the OCIMU, for a capacitive load of 1 μF, the accuracy of the circuit presented here is 100 times better for currents in the range of 0 to 100 μA, while the measurement speed is only 2 times slower.

When the monitor circuit is realised according to the second basic configuration, as shown in FIG. 2, then the following comparison can be made. The proposed monitor can either be used as an on- or off-chip monitor. The monitor reaches measurement rates ranging from 50 kHz–500 kHz for capacitive loads ranging respectively from 3 μF–1 pF. Resolution and accuracy can be changed without loss of speed by changing the value of the current to voltage converting resistor and ranges from 100 nA–400 nA for current ranges from 0 to 190 μA (100 nA resolution) or to 940 μA (400 nA resolution). The current to voltage conversion is linear within these current ranges. Compared to the QuiC-Mon, the circuit presented here can drive much higher capacitive loads and has a much broader measurement range, while the accuracy is comparable. In comparison to the OCIMU, the measurement speed is 8 times better for the same capacitive loading range while the accuracy is 2.5 times better for the same measurement range. For a smaller measurement range the accuracy is even 5 times better. The desired accuracy and measurement range can be easily changed without loss off speed, and loss of capacitive driveability.

Compared to built-in current monitors, the circuit presented here can measure ranges of currents without changing the overhead of the monitor. The possible measurement ranges are much larger and the speed is either comparable or faster and does not depend upon loading conditions. The current to voltage conversion characteristics are linear, which makes it easy to calibrate the monitor.

REFERENCES

[Mal] W. Maly and M. Patyra, "Built-in Current Testing", IEEE Journal of Solid State Circuits, pp. 425–428, Vol. 27, No. 3., March 1992

[She] T. L. Shen, J. C. Dali and J. C. Lo, "A 2ns Detecting Time, 2 μm CMOS Built-in Current Sensing Circuit", *IEEE Journal of Solid State Circuits*, Vol. 28, No. 1, 1993, pp. 72–77.

[Hsu] C. Hsue and C. Liu, "Built-in current sensor for $I_{DDQ}$ in CMOS", *Proc. of ITC*, 1993, pp. 635–641.

[Rub] A. Rubio, E. Janssens, H. Casier, J. Figueras, D. Mateo, P. De Pauw and J. Segura, "A built-in quiescent current monitor for CMOS VLSI circuits", *Proc. of ED&TC 1995*, Paris, France, March 1995, pp. 581–585.

[Lup] E. Lupon, G. Górriz, C. Martinez and J. Figueras, "Compact BIC sensor for $I_{DDQ}$ testing of CMOS Circuits", Electronics Letters, Vol. 29, No. 9, April 1993, pp. 772–774.

[Man] H. Manhaeve et al., "An Off-chip $I_{DDQ}$ Current Measurement Unit for Telecommunication ASICs", *Proceedings of the ITC94*, Washington D.C., USA, October 1994, pp. 203–212.

[Wal] K. M. Wallquist, A. W. Righter, and C. F. Hawkins, "A General Purpose $I_{DDQ}$ Measurement Circuit," *International Test Conference* 1993, Paper 31.3, 1993, pp. 642–651.

What is claimed is:

1. A system for the measurement of the supply current of an electronic circuit, comprising:

a bypass switch adapted for connection to an input voltage, said bypass switch having a measurement mode and a bypass mode; and, a measurement unit connected to said bypass switch for delivering a supply voltage and a supply current to the electronic circuit when said bypass switch is in said measurement mode, wherein said supply voltage is essentially equal to the input voltage, said measurement unit further comprising a second output for providing a measurement current that is proportional to said supply current, wherein said measurement unit comprises:

an operational amplifier;

a voltage level shifter for shifting the output voltage of said operational amplifier to another level;

two complementary MOS transistors connected to said voltage level shifter, said two transistors providing said supply voltage; and a first and second current mirror connected to said two transistors, said first and second current mirrors creating a measurement current proportional to the supply current of the electronic circuit.

2. The system as recited in claim 1 wherein said measurement unit is an integrated circuit.

3. The system as recited in claim 1 wherein said measurement unit is integrated with the electronic circuit on one integrated circuit.

4. The system as recited in claim 1 wherein said bypass switch is a compensated switch for minimizing the charge transfer from said switch to the electronic circuit.

5. The system as recited in claim 1 further comprising a current comparator for comparing said measurement current with a reference.

6. The system as recited in claim 5, further comprising a latch for retaining the output voltage of said current comparator.

7. The system as recited in claim 5 wherein said measurement unit and said current comparator are integrated with the electronic circuit on one integrated circuit.

8. The system as recited in claim 6 wherein said measurement unit, said current comparator, and said latch are integrated with the electronic circuit on one integrated circuit.

9. The system of claim 1 wherein said bypass switch selectively redirects the input voltage directly to the electronic circuit thereby bypassing said measurement unit.

10. The system of claim 1 wherein said bypass switch further comprises a trigger input adapted for receiving a trigger signal for selectively placing said bypass switch into said measurement mode and said bypass mode.

11. The system as recited in claim 1 wherein the measurement current of said current mirrors is greater than or equal to the supply current of the electronic circuit.

12. The system as recited in claim 1 wherein said current mirrors include a plurality of transistors to generate a mirrored current, said plurality of transistors being selectively activated.

13. The system of claim 1 wherein each of said complementary MOS transistors are connected to one of said current mirrors to generate said measurement current and said supply current.

\* \* \* \* \*

UNITED STATES PATENT AND TRADEMARK OFFICE
CERTIFICATE OF CORRECTION

PATENT NO.   : 6,118,293
DATED        : September 12, 2000
INVENTOR(S)  : Manhaeve et al.

It is certified that error appears in the above-identified patent and that said Letters Patent is hereby corrected as shown below:

<u>Title page,</u>
Item [73], please add -- Assignee: Interuniversitair Micro-Elektronica Centrum (Imec, vzw), Leuven, Belgium --

Signed and Sealed this

Twenty-ninth Day of October, 2002

*Attest:*

JAMES E. ROGAN
*Attesting Officer*     *Director of the United States Patent and Trademark Office*